United States Patent
Usami et al.

(10) Patent No.: US 6,319,844 B1
(45) Date of Patent: Nov. 20, 2001

(54) METHOD OF MANUFACTURING SEMICONDUCTOR DEVICE WITH VIA HOLES REACHING INTERCONNECT LAYERS HAVING DIFFERENT TOP-SURFACE WIDTHS

(75) Inventors: Tatsuya Usami; Hidenobu Miyamoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/544,490

(22) Filed: Apr. 7, 2000

(30) Foreign Application Priority Data

Apr. 9, 1999 (JP) .................................................. 11-102702

(51) Int. Cl.[7] ........................ H01L 21/302; H01L 21/461
(52) U.S. Cl. ........................ 438/735; 438/723; 438/737; 438/738; 438/743
(58) Field of Search .................................... 438/735, 737, 438/738, 743, 723

(56) References Cited

U.S. PATENT DOCUMENTS

| | | | |
|---|---|---|---|
| 4,668,338 | * 5/1987 | Maydan et al. | 156/643 |
| 5,378,318 | * 1/1995 | Weling et al. | 156/662 |
| 6,022,810 | * 2/2000 | Kusumi et al. | 438/738 |
| 6,083,845 | * 7/2000 | Yang et al. | 438/734 |
| 6,103,137 | * 8/2000 | Park | 216/67 |
| 6,133,137 | * 10/2000 | Usami | 438/622 |

FOREIGN PATENT DOCUMENTS

| | | | |
|---|---|---|---|
| 0 266 522 | * 9/1987 | (EP) | 21/31 |
| 7-226531 | 8/1995 | (JP) . | |
| 2560637 | 9/1996 | (JP) . | |

* cited by examiner

*Primary Examiner*—Matthew Smith
*Assistant Examiner*—Lex H. Malsawma
(74) *Attorney, Agent, or Firm*—Young & Thompson

(57) ABSTRACT

According to a fabrication method of a semiconductor device, differing areas of metal interconnect layers 102a and 102b are formed on top of interlayer base layer 101. An HSQ layer 103 is then deposited over them. A plasma $SiO_2$ is then deposited on top of the HSQ film 103. Afterwards, the top surface of the plasma $SiO_2$ film 104 is subjected to the CMP process so that its surface can be smoothed. A photoresist film 105 is deposited on top of the $SiO_2$ film 104 and then patterned for a subsequent step of making via holes. Afterwards, the insulation film 104 and HSQ film 103 are selectively etched so as to dig via holes 110 so that the bottoms 120 of the via holes 110 respectively end at the top surfaces of the interconnect layers 102a and 102b. This etching is performed using a mixture of a fluorine-based gas and a hydrogen-based gas.

19 Claims, 3 Drawing Sheets

METHOD OF MANUFACTURING SEMICONDUCTOR DEVICE WITH VIA HOLES REACHING INTERCONNECT LAYERS HAVING DIFFERENT TOP-SURFACE WIDTHS

BACKGROUND OF THE INVENTION

1. Field of the Invention

The present invention relates to a manufacturing method of a semiconductor device. It particularly relates to a manufacturing method of a semiconductor device with varying widths of interconnect layers; wherein, an HSQ layer is used as the interlayer insulating film and the bottom of the via hole that reaches the concerned interconnect layer exactly ends only at the upper surface of the concerned interconnect layer.

2. Related Arts

Conventionally, it is known that the working speed of a semiconductor device decreases as the product (RC) of the wiring resistance (R) and the parasitic capacitance (C) between interconnects increases; Meanwhile, the parasitic capacitance (C) between interconnects increases in an inverse proportion to the distance between interconnects. Therefore, in order to improve the working speed of the semiconductor device, it is important to decrease the parasitic capacitance between interconnects.

From this viewpoint, a technique for forming an insulating layer with a low dielectric constant between densely positioned interconnects is widely used. The HSQ (hydrogen silsesquioxane) layer is an example of this type of low dielectric constant insulating layer. An example of an etching technique using this HSQ layer will now be described using FIGS. 1A and 1B and FIGS. 2A and 2B. Namely, as shown in FIG. 1A, a metal interconnect 202 with a TiN/Ti/Al—Cu/TiN stucture and a total thickness of approximately 600 nm is formed on top of interlayer base film 201 made of a plasma $SiO_2$ film. On top of that, an HSQ layer 203 of approximately 400 nm is spin-coated and then let to cure.

Nest, a second plasma $SiO_2$ layer 204 of approximately 1400 nm is formed and smoothed out using chemical/mechanical polishing (hereafter called CMP) resulting in an insulating layer of 700 nm on the metal interconnects.

Next, as shown in FIG. 1B, a photoresist is deposited and patterned so as to assist in forming a thru hole. Afterwards, an oxidized film dry etching system with its etching parameters being optimally set so as for the interlayer films 204 and 203 on top of the smaller area of a metal interconnect to be partially etched off, etches the P—$SiO_2$/HSQ films using a $C_4F_8$/Ar/$O_2$/CO gas chemistry. As a result, the HSQ layer on top of the smaller area of a metal interconnect is successfully etched off, but the HSQ layer above the larger 1 $nm^2$ area of metal interconnect is left partially un-etched, as shown in FIG. 2A.

In another example, if $O_2$ gas is increased in order to improve the effectiveness of the etching on the larger area of metal interconnects, then the thru hole formed above the larger area of metal interconnects is able to reach the surface. However, the small thru hole above the smaller area of metal interconnects ends up being over-etched. Besides, since the etch selectivity to the TiN cannot be sufficiently provided, a large chunk of the upper portion of the smaller area of the metal interconnect is removed, as shown in FIG. 2B. As a result, the expected resistance cannot be provided, thereby making it difficult to stop the etching on top of the TiN layer.

In other words, since the HSQ layer coated on the large area of the metal interconnect is thick, but the one coated on the smaller area is then, and also since a high etch selectivity of the P—$SiO_2$ to the HSQ is provided, the etching rate decreases in the very small hole in the HSQ layer. Therefore the etching cannot go all the way through the part where the HSQ is thick. This is because the processing of the very small holes in the HSQ leads to hydrogen developing inside the HSQ layer during etching, and the fluorine part of the etchant is then accordingly released as a HF gas, which causes the etching to cease.

Furthermore, when the etching process is used to dig a hole in the thick HSQ layer, it is difficult to achieve etching that ends exactly on top of the TiN layer. This is because the etching time is increased when etching a thick HSQ layer, but this also results in the over-etching of the TiN metal where the HSQ is thin.

For example, according to Japanese Patent Application Laid-open No. Hei 7-226531, the usage of mesa photodetectors in order to reduce the parasitic capacitance originating from the electrodes or pads is described, but the structure with HSQ layers is not described.

Furthermore, Japanese Patent No. 2560637 describes, with the purpose of reducing the parasitic capacitance in order to increase the speed of the FETs, techniques to set up spacers that have a lower dielectric constant than the oxidized silicon on the surface of the gate electrode side. However, semiconductor devices using HSQ layers are not described.

SUMMARY OF THE INVENTION

Therefore, the purpose of the present invention is to improve the defects in the above-mentioned techniques, and provide a method of manufacturing a semiconductor device in which the bottom of each via hole where plugs connect to interconnect layers ends exactly at the surface of said interconnect layers.

According to an aspect of the present invention, a method of fabricating a semiconductor device, which is comprised of differing top surface areas of respective interconnect layers, a first insulation layer with a low dielectric constant that is deposited over said differing top surface areas of the respective interconnect layers, and a second insulation layer that is deposited on top of said first insulation layer, is provided and is comprised of the step of etching both parts of said first and said second insulation layer on top of said differing top surface areas of the respective interconnect layers, successively under the condition such that the etch selectivity of said first insulation layer to the second insulation layer is equal to almost 1, so as to make via holes. An example of this method is shown in FIGS. 3A to 3D.

BRIEF DESCRIPTION OF DRAWINGS

The above and other objects, features and advantages of the present invention will become more apparent from the following detailed description, when taken in conjunction with the accompanying drawings, wherein.

DETAILED DESCRIPTION OF THE PREFERRED EMBODIMENTS

A semiconductor device and its manufacturing method, according to an embodiment of the present invention, will be described with reference to the drawings.

First, a point of the semiconductor device and its manufacturing method, according to an embodiment of the present invention, will be described below. The semiconductor device of the embodiment is comprised of variable widths of interconnect layers, including interlayer insulation films such as a HSQ (Hydrogen Silsesquioxane) film. In the step of fabricating a via hole in this semiconductor device, each via hole is formed so that its bottom can be equal to the top surface of each corresponding interconnect layer. In order to attain this, a HSQ film is coated after the metal interconnects are formed, and then followed by the depositing of a plasma $SiO_2$ film. This plasma $SiO_2$ film is then subjected to a CMP process so that its surface can be smoothed. Afterwards, via holes are made by selectively etching both the plasma $SiO_2$ film and the HSQ film in a condition such that the etch selectivity of the plasma $SiO_2$ is equal to that of the HSQ film.

Figure 1A:
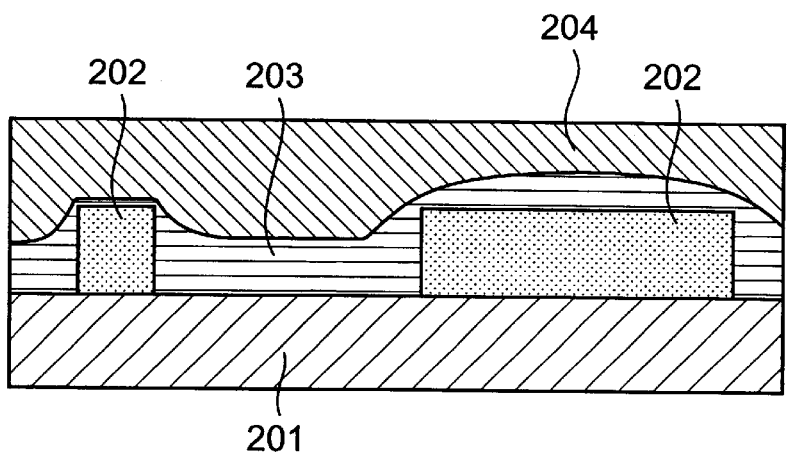
FIGS. 1A and 1B are cross sections respectively, showing main steps of the conventional method of fabricating a semiconductor device.
Figure 1B:
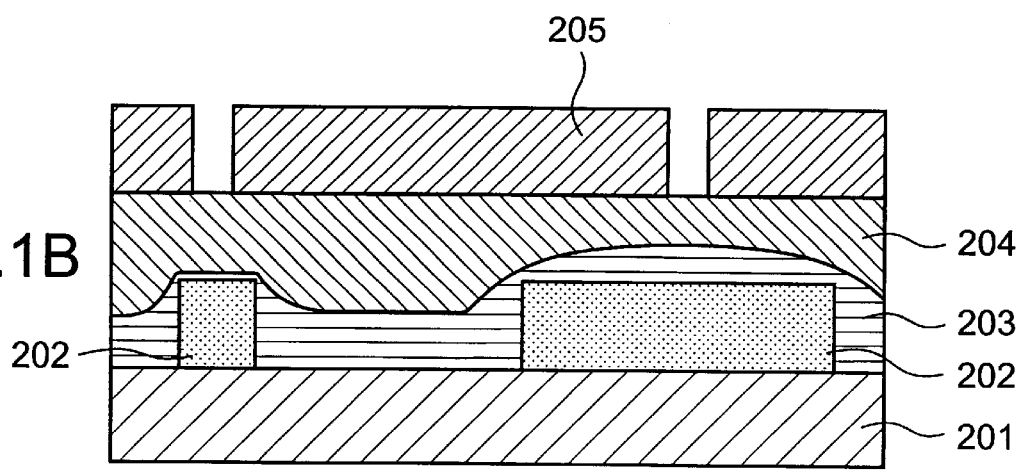
Figure 2A:
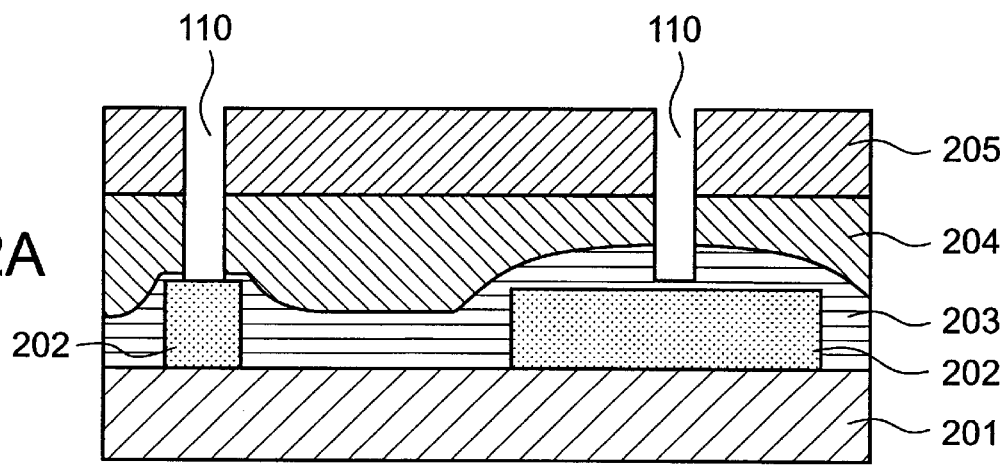
FIGS. 2A and 2B are cross sections respectively, explaining the defects in the conventional method of manufacturing the semiconductor device.
Figure 2B:
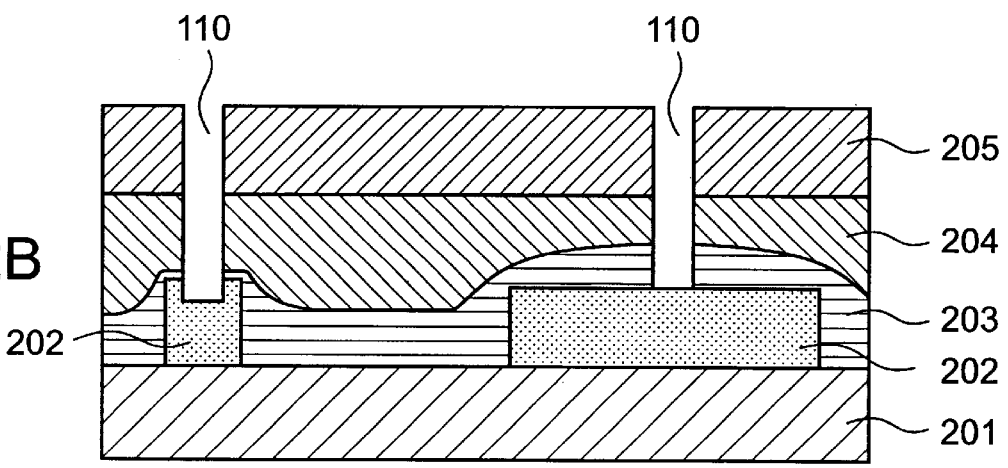
Figure 3A:
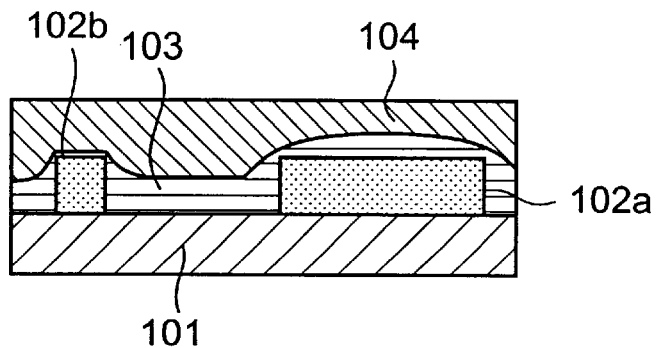
FIGS. 3A and 3D are cross sections respectively, showing main steps of a method of fabricating a semiconductor device, according to an embodiment of the present invention.
Figure 3B:
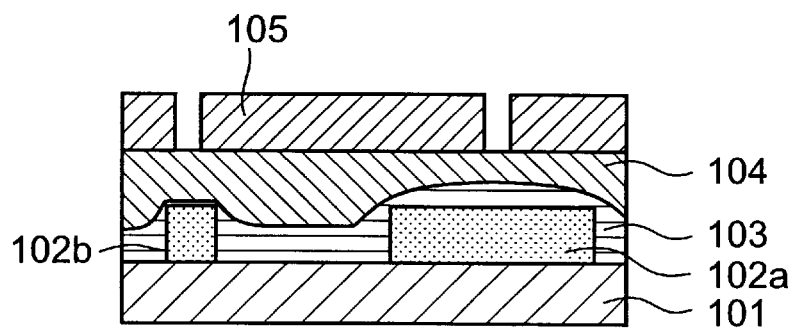
Figure 3C:
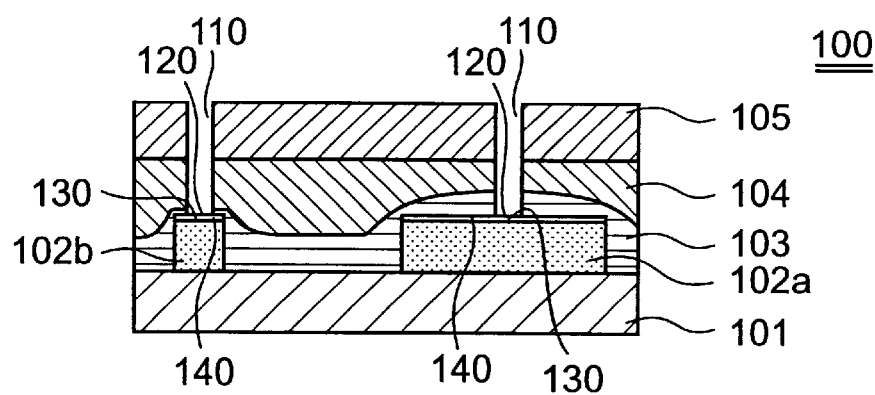
Figure 3D:
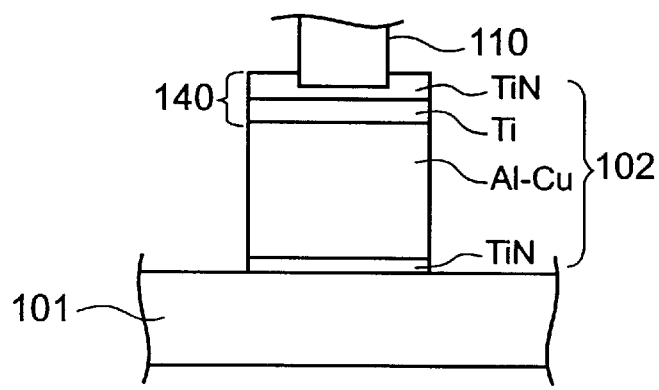

Next, a detailed structure of the semiconductor of the embodiment is described while referencing FIGS. 3C and 3D. FIG. 3C is a cross section showing an example of a structure of the semiconductor device 100 of the embodiment, which is comprised of the elements: an interlayer base film 101; differing widths (or areas 130) of interconnect layers 102a and 102b, which are formed on the interlayer base film 101; an HSQ film 103, which is deposited over the interconnect layers 102a and 102b; and an insulation film 104, which is deposited on top of the HSQ film 103. A patterned photoresist film 105 is used to make via holes 110 by selectively etching the insulation film 104 and HSQ film 103 so that the bottoms 120 of the via holes 110 respectively end at the surfaces of the interconnect layers 102a and 102b. FIG. 3D shows an enlarged cross section of either one of the interconnect layers 102a or 102b and the via hole 110. As shown in FIG. 3D, each of the interconnect layers 102a and 102b are made up of, for example, a TiN layer, a Ti layer, an Al—Cu layer, and a TiN layer. The upper layers of the TiN layer and Ti layer constitute a barrier metal layer. It is preferable that the bottom 120 of the via hole 110 ends at the surface of the barrier metal layer 140. It is further preferable that the bottom 120 of the via hole 110 ends inside the barrier metal layer 140, as shown in FIG. 3D. It is yet further preferable that the bottom 120 of the via hole 110 ends inside the upper TiN layer.

In FIG. 3C, it is preferable that the insulation film 104 is made of a silicon oxide. However, it is more preferable that the insulation film 104 be made of a plasma silicon oxide. Furthermore, it is preferable that the interconnect layers 102a and 102b are made of a metal interconnect layer such as aluminum. However, they are not limited to this. Any another conductive material can be used for the interconnect layers 102a and 102b.

Next, a detailed method of fabricating the semiconductor device 100, according to an embodiment of the present invention, will be described below with reference to FIGS. 3A to 3D. FIG. 3A is a cross section showing a structure immediately before the step of forming via holes is performed. In FIG. 3A, differing areas of metal interconnect layers 102a and 102b are formed on top of the interlayer base layer 101. An HSQ layer 103 is then deposited over them. A plasma $SiO_2$ is then deposited on top of the HSQ film 103. Afterwards, the top surface of the plasma $SiO_2$ film 104 is subjected to the CMP process so that its surface can be smoothed, as described above. As shown in FIG. 3B, a photoresist film 105 is deposited on top of the $SiO_2$ film 104 and then patterned for a subsequent step of making via holes. Afterwards, as shown in FIG. 3C, the insulation film 104 and HSQ film 103 are selectively etched so as to dig via holes 110 so that the bottoms 120 of the via holes 110 respectively end at the surfaces of the interconnect layers 102a and 102b.

Incidentally, the fact that there are differing top areas of interconnect layers 102a and 102b formed on top of the interlayer base layer 101 causes the thickness of the HSQ film 103 over the large area of the interconnect layer 102a to be longer than that of it over the smaller area of the interconnect layer 102b. In this situation, if the conventional etching process is used to dig the via holes 110, the bottoms 120 of the via holes 110 cannot respectively reach the top surfaces of the inter connect layers 102a and 102b, simultaneously. To solve this problem, according to the fabricating method for the semiconductor device of the embodiment, the etching is performed under the condition such that the etch selectivity of the insulation film 104 is equal to that of the HSQ film 103. It is preferable that a dry-etching process, using a mixture of fluorine-based and hydrogen-based gases, performs the etching. Specifically, a fluorocarbon gas (i.e., $C_xF_y$) and a gas containing hydrogen, for example, are used for the dry-etching process. Furthermore, it is preferable that $CF_4$, $C_4F_8$, etc. be used. Besides, it is preferable that the concentration of hydrogen-based gas be high in the mixture, and that either a hydrogen gas, $CH_4$ gas, $PH_3$ gas, or $B_2H_6$ gas be used for it.

Next, the fabricating method will be further described in more detail with reference to FIGS. 3A to 3D. In FIG. 3A, a substrate or an interlayer base film 101 made of plasma $SiO_2$ is deposited. Metal interconnect layers of approximately 600 nm in thickness, each being made up of a TiN film, a Ti film, a Al—Cu film, and a TiN film, are formed on the interlayer base layer 101. They are then processed with a chlorine-based gas, as an example.

Afterwards, an HSQ film 103 of approximately 400 nm in thickness is coated over the resultant surface and its top surface is then let to cure. An insulation layer 104 of approximately 1400 nm in thickness, and made of a plasma $SiO_2$ film, is deposited on top of the HSQ film 103. The top surface of the plasma $SiO_2$ film 104 is then subjected to the CMP process so that it can be smoothed. As a result, an $SiO_2$ insulation film 104 with an approximately thickness of 700 nm is left.

In FIG. 3B, the photoresist film 105 is deposited on top of the resultant surface and then patterned. Afterwards, using a mixture of a $C_4F_8/Ar/O_2/CO$ gas chemistry plus a mixed gas of 4% $H_2+N_2$ (i.e., the volume ratio of the $H_2$ gas to the total volume of the mixed gas of $H_2+N_2$ is equal to 4%), an oxide film dry-etcher selectively etches off both the insulation film 104 or the plasma $SiO_2$ film and the HSQ film 103, so as to dig the via holes 110, as shown in FIG. 3C. Since dry-etching with the mixture of the above gases allows the etch selectivity of the plasma $SiO_2$ film 104 to the HSQ film 103 to be equal to almost one, and the etch selectivity of each of them to the TiN film (the barrier metal in the upper part of the interconnect layer 102) is equal to 20. The addition of the (4% $H_2+N_2$) gas causes the etching rates of the respective plasma $SiO_2$ film 104 and HSQ film 103 to be small, but causes the etch selectivity of each of them to the other to be equal to almost one. Therefore, the etching rate on the large area of the metal interconnect layer 102a is almost equal to that of the smaller area of the metal interconnect layer 102b. This prevents aforementioned etching defects from occurring.

Incidentally, the case where 4% $H_2$ is mixed with the $C_4F_8/Ar/O_2/CO$ gas chemistry has been explained. However, the present invention is not limited to this. The higher the concentration of $H_2$ in the mixture, the closer the etch selectivities of the respective plasma $SiO_2$ film 104 and the HSQ film 103 are to each other; all the while maintaining the high etch selectivities respectively of them to the TiN film in the metal interconnect layers 102a and 102b.

Furthermore, any one of a $CH_4$ gas, a $PH_3$ gas, or a $B_2H_6$ gas can be used in place of the gas with $H_2$ such as the (4% $H_2+N_2$) gas. If $CH_4$ gas is used for dry-etching, then a film, which helps the etching proceed in the vertical direction but prevents the etching from proceeding in the horizontal direction, is deposited on the side wall of each via hole. Otherwise, if $PH_3$ gas is used for etching, the usage of a metal plug made of, for example, Cu (copper) causes the generation of a PSG film, which functions as a Cu diffusion barrier even if the barrier metal layer is incompletely formed. If $B_2H_6$ gas is used for etching, a possible occurrence of a crack on the HSQ film can be prevented.

Furthermore, in the above description, the case where the $C_4F_8/Ar/O_2/CO$ gas chemistry is used for dry-etching, with $C_4F_8$ gas as a base gas is explained. However, these gases, except for $C_4F_8$ gas, are not always necessary for dry-etching. Besides which, combinations of other gases with $C_4F_8$ gas can be alternatively used.

Furthermore, the case where a fluorocarbon gas ($C_xF_y$) is used as a base gas in the dry-etching process has been described. However, the present invention is not limited to this. Alternatively, a fluorosulfur (e.g., $SF_6$) gas can be used in place of the fluorocarbon gas.

(Result of the present invention)

As described above, the usage of a mixed gas resulting from adding a hydrogen-based gas such as a ($H_2+N_2$) gas to the mixture of either a fluorocarbon ($C_xF_y$) gas or a fluorosulfur (e.g., $SF_6$) gas for the etching process of the HSQ film and $SiO_2$ film so as to dig via holes on top of differing areas of interconnect layers, provides almost the same etch selectivity for both the HSQ film and the $SiO_2$ film. This enables the generation of bottoms for respective via holes, which end at the surface of differing areas of interconnect layers.

A method of fabricating a semiconductor device, according to the present invention, has been described in connection with several preferred embodiments. It is to be understood that the subject matter encompassed by the present invention is not limited to that specified embodiment. On the contrary, it is intended to include all alternatives, modifications, and equivalents as can be included within the spirit and scope of the following claims.

What is claimed is:

1. A method of manufacturing a semiconductor device, comprising the steps of:
   providing two interconnect layers having different top surface widths;
   depositing a hydrogen silsesquioxane (HSQ) insulating layer over the two interconnect layers;
   depositing a second insulating layer over the HSQ insulating layer, the second insulating layer being a material different than the HSQ insulating layer; and
   etching through said first and second insulating layers to form via holes that open to the top surfaces of the two interconnect layers, the etching being performed with a mixture of a fluorine-based gas and hydrogen-based gas that are mixed to provide a ratio of an etch selectivity of the first insulating layer to an etch selectivity of the second insulating layer that is equal to almost 1.

2. The method, according to claim 1, wherein said second insulation layer is made of an $SiO_2$ film.

3. The method, according to claim 1, wherein said hydrogen-based gas is any one of an ($H_2+N_2$) gas, a $CH_4$ gas, a $PH_3$ gas, or a $B_2H_6$ gas.

4. The method, according to claim 1, wherein said fluorine-based gas is either a fluorocarbon gas or a fluorosulfur gas.

5. The method, according to claim 4, wherein said fluorosulfur gas is made of $SF_6$.

6. The method, according to claim 4, wherein said fluorocarbon gas is made of either $CF_4$ or $C_4F_8$.

7. The method, according to claim 1, wherein said fluorine-based gas contains at least any one of $C_xF_y$, Ar, $O_2$, or CO.

8. The method, according to claim 1, wherein the top surface of said second insulation layer is smoothed.

9. The method, according to claim 1, wherein the etching is performed through a dry etching process.

10. A method of manufacturing a semiconductor device, comprising steps of:
    forming a first interconnect layer and a second interconnect layer on a substrate, said second interconnect layer having a second top surface area that is larger than a first top surface area of said first interconnect layer;
    forming a hydrogen silsesquioxane film on said first interconnect layer and said second interconnect layer;
    forming an insulating layer on said hydrogen silsesquioxane film; and
    etching said insulating layer and said hydrogen silsesquioxane film to form a first via hole reaching said first top surface area and a second via hole reaching said second top surface area;
    wherein said etching step is performed using a mixture of etching gas under a condition, such that a first etching rate of said hydrogen silsesquioxane film and a second etching rate of said insulating layer are about the same.

11. The method of manufacturing a semiconductor device as claimed in claim 10, further comprising a step of:
    forming a first barrier metal layer on said first interconnect layer and a second barrier metal layer on said second interconnect layer; and
    wherein said step of etching stops when a first surface of said first barrier metal layer and a second surface of said second barrier metal layer is exposed.

12. The method of manufacturing a semiconductor device as claimed in claim 11,
    wherein said first barrier metal layer comprises a first TiN layer and a first Ti layer and said second barrier metal layer comprises a second TiN layer and a second Ti layer, and
    wherein said step of etching stops when a surface of said first TiN layer and a surface of said second TiN layer is exposed.

13. The method of manufacturing a semiconductor device as claimed in claim 10, wherein said insulating layer comprises a $SiO_2$ layer.

14. The method of manufacturing a semiconductor device as claimed in claim 13, wherein said mixture of etching gas comprises a fluorine-based gas and a hydrogen-based gas.

15. The method of manufacturing a semiconductor device as claimed in claim 14, wherein said hydrogen-based gas is $H_2$ gas.

16. The method of manufacturing a semiconductor device as claimed in claim 15, wherein a selectivity of said hydrogen silsesquioxane film to said first TiN layer is more than 20.

17. The method of manufacturing a semiconductor device as claimed in claim 15, wherein said fluorine-based gas is $C_4F_8$.

18. A method of manufacturing a semiconductor device comprising steps of:

forming a first interconnect layer and a second interconnect layer on a substrate, said second interconnect layer having a second top surface area that is larger than a first top surface area of said first interconnect layer;

forming a hydrogen silsesquioxane film on said first interconnect layer and said second interconnect layer;

forming an insulating layer on said hydrogen silsesquioxane film; and etching said insulating layer and said hydrogen silsesquioxane film to form a first via hole reaching said first top surface area and a second via hole reaching said second top surface area;

wherein said etching step is performed using a mixture of etching gas under a condition, such that a first etching rate of said hydrogen silsesquioxane film and a second etching rate of said insulating layer are about the same, said mixture comprising $C_4F_8$, Ar, $O_2$, CO and $H_2$.

19. A method of etching a via hole through two insulating layers of different materials where one of the insulating layers releases hydrogen when exposed to an etchant to slow an etch rate of the one insulating layer, the method comprising the step of adding sufficient hydrogen-based gas to the etchant to slow an etch rate of the other of the two insulating layers to be nearly equal to the etch rate of the one insulating layer.

* * * * *